United States Patent
DiVergilio et al.

(10) Patent No.: US 7,531,819 B2
(45) Date of Patent: May 12, 2009

(54) FLUORINE BASED CLEANING OF AN ION SOURCE

(75) Inventors: William F. DiVergilio, Brookline, MA (US); Daniel R. Tieger, Manchester, MA (US); William P. Reynolds, Canton, MA (US); Christopher W. Hodgdon, East Kingston, NH (US); Sean Joyce, Stoneham, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 427 days.

(21) Appl. No.: 11/540,469

(22) Filed: Sep. 29, 2006

(65) Prior Publication Data
US 2007/0137671 A1  Jun. 21, 2007

(51) Int. Cl.
*H01J 37/08* (2006.01)
*H01J 37/317* (2006.01)

(52) U.S. Cl. ............... 250/492.21; 134/1.1; 250/423 R; 250/424

(58) Field of Classification Search ............ 250/492.21; 134/1.1
See application file for complete search history.

(56) References Cited

U.S. PATENT DOCUMENTS

| | | | | |
|---|---|---|---|---|
| 5,413,670 | A | * | 5/1995 | Langan et al. ................ 134/1.2 |
| 6,135,128 | A | | 10/2000 | Graf et al. |
| 2007/0210260 | A1 | * | 9/2007 | Horsky et al. ............... 250/424 |

FOREIGN PATENT DOCUMENTS

| EP | 0 945 892 A2 | 9/1999 |
|---|---|---|
| WO | WO 2004/008828 A2 | 1/2004 |
| WO | WO 2005/059942 A2 | 6/2005 |

OTHER PUBLICATIONS

International Search Report, Int'l App. No. PCT/US2006/048999, Int'l Filing Date Dec. 20, 2006, 2 pgs.

\* cited by examiner

*Primary Examiner*—Jack I Berman
(74) *Attorney, Agent, or Firm*—Eschweiler & Associates, LLC

(57) ABSTRACT

A deposit cleaning system for removing deposits from interior surfaces of ion sources and/or electrodes includes a fluorine source, a throttle mechanism, and a controller. The fluorine source supplies fluorine to the ion source as a cleaning material. The throttle mechanism mitigates loss of fluorine through a source aperture of the ion source by at least partially covering the source aperture. The controller controls the supply and flow rate from the fluorine source to the ion source and also controls the positioning of the throttle mechanism.

26 Claims, 9 Drawing Sheets

FLUORINE BASED CLEANING OF AN ION SOURCE

FIELD OF INVENTION

The present invention relates generally to semiconductor device fabrication and ion implantation, and more particularly, cleaning ion sources of ion implantation systems using fluorine.

BACKGROUND OF THE INVENTION

Ion implantation is a physical process that is employed in semiconductor device fabrication to selectively implant dopant into semiconductor and/or wafer material. Thus, the act of implanting does not rely on a chemical interaction between a dopant and semiconductor material. For ion implantation, dopant atoms/molecules are ionized, accelerated, formed into a beam, analyzed, and swept across a wafer, or the wafer is swept through the beam. The dopant ions physically bombard the wafer, enter the surface and come to rest below the surface, at a depth related to their energy.

Ion implanters or ion implantation systems typically include an ion source including an ionization chamber for ionizing a neutral gas from gaseous feed material or from vapor generated from a solid or liquid feed material to produce a collection of charged particles, i.e. ions and electrons, hereinafter referred to as a plasma. Ions are extracted from the ion source plasma by creating an electric field between the source plasma and an electrode, or a series of electrodes, to form an ion beam. The beam travels through specially shaped apertures in each of the electrodes. Typical beam extraction systems are either 3 or 4 electrode systems, although other variations are possible, including very extended systems where final beam deceleration is accomplished in the proximity of the wafer. A standard three electrode system typically comprises a first electrode, the so-called plasma electrode, or arc slit electrode, or ionization chamber electrode, which may be electrically biased at the same large positive voltage as the ion source. This potential determines the beam energy. A second electrode, the so-called suppression electrode, is at a moderate negative voltage to prevent electrons from streaming back to the source chamber. A third and final electrode, the so-called ground electrode, is at ground potential. The extracting electric field is determined by the potential difference between the ionization chamber electrode and the suppression electrode, the details of their shapes, and the distance there between. In many ion implantation processes, it is necessary to generate beams of very different energies and different species for different doping properties, for example 5 kV boron for source-drain extensions and 80 kV arsenic for punchthrough stop. The strength of the electric fields generated by the electrodes must be tuned and adjusted to match the desired extracted beam current and maintain good ion beam optics. This process is called perveance matching. One of the most common methods for achieving good perveance matching is to move the suppression and ground electrodes relative to the ion source, more specifically, the ionization chamber electrode. The distance between the ionization chamber electrode, which defines the ionization chamber aperture, and the suppression electrode, which defines the suppression aperture, is called the extraction gap.

When the ion source is operated with a molecular fill gas or vapor, other species in addition to the desired species for implantation are produced. Some of these species may have very low vapor pressures, and as a result condense on the interior surfaces of the source. These solid deposits may interfere with ion source operation over time, for example by changing the electrical characteristics of the walls or partially blocking the ion source electrode aperture, thereby reducing the available ion current. One method of removing these deposits is the time consuming process of removing the ion source from the system and physically cleaning the source. Another method would be to clean the source in situ by flowing a highly reactive gas through the source, where the gas species is chosen such that the reaction with the deposited material results in a high vapor pressure material which leaves the ion source as a gas and is pumped out of the system. A species with the desired characteristics is atomic fluorine, typically generated by the dissociation of $NF_3$ in a plasma. However, relatively large flow rates of the reactive gas are required to perform proper cleaning of the ion source surfaces. The relatively large flow rates adversely affect both tool cost and cost of operation.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

Aspects of the present invention facilitate ion implantation processes by performing cleanings of surfaces within ion sources by using a cleaning material, such as atomic fluorine. The cleanings can be performed with lower flow rates than conventional fluorine based cleanings by employing a throttle mechanism that at least partly traps, for example, fluorine within the ion source to facilitate cleaning of the ion source.

A deposit cleaning system for removing deposits from interior surfaces of ion sources includes a fluorine source, a throttle mechanism, and a controller. The fluorine source supplies fluorine to the ion source as a cleaning material. The throttle mechanism mitigates loss of fluorine through a source aperture of the ion source by at least partially covering the source aperture. The controller controls the supply and flow rate from the fluorine source to the ion source and also controls the positioning of the throttle mechanism. Other systems, methods, and detectors are also disclosed.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
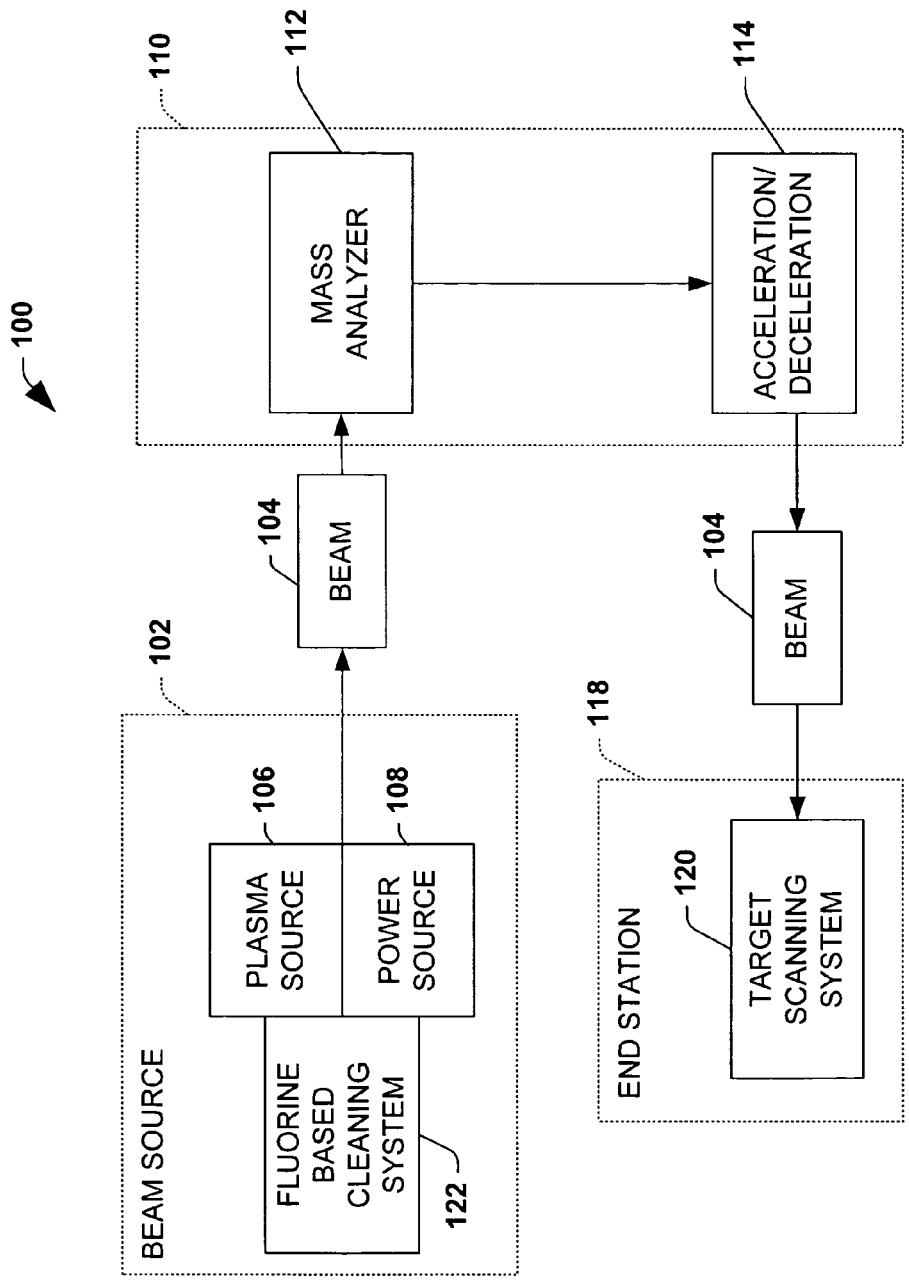
FIG. 1 is an ion implantation system suitable for implementing one or more aspects of the present invention in block diagram form.

The present invention will now be described with reference to the attached drawings, wherein like reference numerals are used to refer to like elements throughout. It will be appreciated by those skilled in the art that the invention is not limited to the exemplary implementations and aspects illustrated and described hereinafter.

Atomic fluorine (fluorine radicals) can be employed to clean surfaces of ion sources. Pure fluorine is toxic and difficult to handle. As a result, a fluorine compound, such as $NF_3$, is typically used as a source of atomic fluorine. Atomic fluorine is generated by the dissociation of $NF_3$ in a plasma. In one example, the plasma may be remote from the surfaces to be cleaned and the dissociated gas transported to the surfaces. Alternately, the atomic fluorine can be formed or generated within an ion source to clean the surfaces. In either case, large flow rates of $NF_3$ are required, for example, due to recombination of atomic fluorine in a region between a remote source and the ion source surfaces to be cleaned and uncombined atomic fluorine exiting the ion source through the source aperture.

Aspects of the present invention employ a throttle mechanism at or near a source aperture of an ion source. The throttle mechanism reduces quantities of atomic fluorine lost through the aperture and directs fluorine atoms back toward surfaces to be cleaned within the source. Additionally, the throttle mechanism can direct atoms to outer edges of the aperture, thereby providing enhanced cleaning of these surfaces. For normal ion source operation, the throttle mechanism is positioned so as to not interfere.

Referring initially to FIG. 1, an ion implantation system 100 suitable for implementing one or more aspects of the present invention is depicted in block diagram form.

The system 100 includes an ion source 102 for producing an ion beam 104 along a beam path. The ion beam source 102 includes, for example, a plasma source 106 with an associated power source 108. The plasma source 106 may, for example, comprise a relatively long plasma confinement chamber from which an ion beam is extracted and accelerated.

Other species in addition to a desired species can be produced during operation of the ion source 102. Some of these species may have very low vapor pressures, and as a result, may condense on the interior surfaces of the ion source 102. These solid deposits may interfere with ion source operation over time, for example by changing the electrical characteristics of the walls or partially blocking the ion source electrode aperture, thereby reducing the available ion current.

The ion source 102 includes a fluorine based cleaning system 122 that can remove these deposits from interior surfaces of the ion source. The fluorine based cleaning system 122 flows a highly reactive gas, such as fluorine, through the ion source 102, where the gas species is chosen such that the reaction with the deposited material results in a high vapor pressure material which leaves the ion source 102 as a gas and is pumped out of the system. The cleaning system 122 also includes a throttle mechanism that limits or prevents unreacted components of the reactive gas, such as atomic fluorine, from leaving the ion source 102 without reacting with the deposits. As a result of employing the throttle mechanism, relatively lower flow rates can be employed for the reactive gas than in conventional cleaning systems to obtain suitable cleaning of surfaces within the ion source 102.

The cleaning system 122 can be engaged during a cleaning state periodically or as desired in order to reduce or remove the deposits from surfaces within the ion source 102. However, during a normal operating state, the throttle mechanism of the cleaning system 122 is typically disengaged so as to allow passage of the ion beam through the ion source aperture. Otherwise, the throttle mechanism can be engaged to mitigate un-reacted components of the reactive gas from leaving the ion source 102 through the aperture.

A beam line assembly 110 is provided downstream of the ion source 102 to receive the beam 104 there from. The beam line assembly 110 includes a mass analyzer 112, an acceleration structure 114, which may include, for example, one or more gaps. The beam line assembly 110 is situated along the path to receive the beam 104. The mass analyzer 112 includes a field generating component, such as a magnet (not shown), and operates to provide a field across the beam path so as to deflect ions from the ion beam 104 at varying trajectories according to mass (e.g., charge to mass ratio). Ions traveling through the magnetic field experience a force which directs individual ions of a desired mass along the beam path and which deflects ions of undesired mass away from the beam path.

The acceleration gap or gaps within the acceleration structure 114 are operable to accelerate and/or decelerate ions within the beam to achieve a desired depth of implantation in a workpiece. Accordingly, it will be appreciated that while the terms accelerator and/or acceleration gap may be utilized herein in describing one or more aspects of the present invention, such terms are not intended to be construed narrowly so as to be limited to a literal interpretation of acceleration, but are to be construed broadly so as to include, among other things, deceleration as well as changes in direction. It will be further appreciated that acceleration/deceleration means may be applied before as well as after the magnetic analysis by the mass analyzer 112. Additionally, the acceleration structure 114 can also be part of the ion source, in some aspects, and omitted as part of the beam line assembly.

An end station 118 is also provided in the system 100 to ion beam 104 from the beamline assembly 110. The end station 118 supports one or more workpieces such as semiconductor wafers (not shown) along the beam path for implantation using the mass analyzed ion beam 104. The end station 118 includes a target scanning system 120 for translating or scanning one or more target workpieces and the ion beam 104 relative to one another. The target scanning system 120 may provide for batch or serial implantation, for example, as may be desired under given circumstances, operating parameters and/or objectives.

Figure 2:
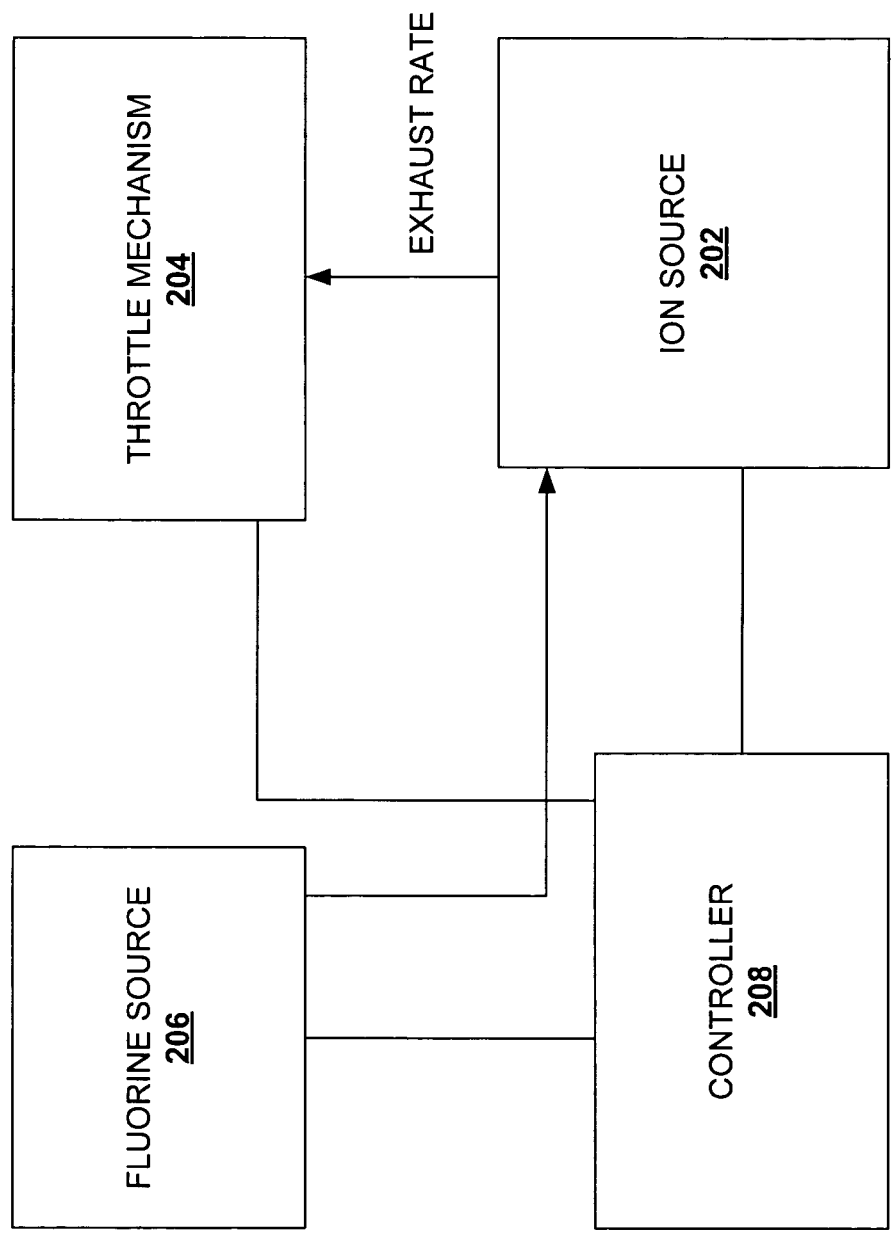
FIG. 2 is a block diagram of a fluorine based cleaning system in accordance with an aspect of the present invention.

FIG. 2 is a block diagram of a fluorine based cleaning system 200 in accordance with an aspect of the present invention. The system 200 is employed to remove deposits from interior surfaces, including apertures, of an ion source 202 with a relatively reduced flow rate. For illustrative purposes, the system 200 is described employing fluorine, however other suitable materials can also be employed.

The system 200 operates on an ion source 202 and includes a throttle mechanism 204, a fluorine source 206, and a controller 208. The ion source 202 may include an ionization chamber for ionizing a neutral gas from gaseous feed material or from vapor generated from a solid or liquid feed material to produce a collection of charged particles, i.e. ions and electrons, hereinafter referred to as a plasma. Ions are extracted from the ion source plasma by creating an electric field between the source plasma and an electrode, or a series of electrodes (not shown), to form an ion beam. The beam travels through specially shaped apertures in each of the electrodes. Typical beam extraction systems are either 3 or 4 electrode systems, although other variations are possible, including very extended systems where final beam deceleration is accomplished in the proximity of the wafer. A standard three electrode system typically comprises a first electrode, the so-called plasma electrode, or arc slit electrode, or ionization chamber electrode, which may be electrically biased at the same large positive voltage as the ion source. This potential determines the beam energy. A second electrode, the so-called suppression electrode, is at a moderate negative voltage to prevent electrons from streaming back to the source chamber. A third and final electrode, the so-called ground electrode, is at ground potential. The extracting electric field is determined by the potential difference between the ionization chamber electrode and the suppression electrode, the details of their shapes, and the distance there between. For some ion implantation processes, it is necessary to generate beams of very different energies and different species for different doping properties, for example 5kV boron for source-drain extensions and 80kV arsenic for punchthrough stop. The strength of the electric fields generated by the electrodes are tuned and adjusted to match the desired extracted beam current and maintain good ion beam optics. This process is called perveance matching. One of the most common methods for achieving good perveance matching is to move the suppression and ground electrodes relative to the ion source, more specifically, the ionization chamber electrode. The distance between the ionization chamber electrode, which defines the ionization chamber aperture, and the suppression electrode, which defines the suppression aperture, is called the extraction gap.

When the ion source 202 is operated with a molecular fill gas or vapor, other species in addition to the desired species for implantation are produced. Some of these species may have very low vapor pressures, and as a result condense on the interior surfaces of the source. These solid deposits can interfere with ion source operation over time, for example by changing the electrical characteristics of the walls or partially blocking the ion source electrode aperture, thereby reducing the available ion current. For example, phosphorous (P) deposits may form on surfaces within the ion source 202 when phosphine ($PH_3$) is run through the ion source 202.

The fluorine source 206 maintains and provides fluorine to the ion source 202 that reacts with and removes deposits formed on the surfaces within the ion source 202. The fluorine source 206 can provide the fluorine as atomic fluorine (fluorine radicals) so as to clean surfaces of the ion source 202. However, pure fluorine is toxic and difficult to handle. As a result, a fluorine compound, such as $NF_3$, is typically used as a source of atomic fluorine. Atomic fluorine is generated by the dissociation of $NF_3$ in a plasma. The result of this disassociation is that the $NF_3$ will disassociate into nitrogen and fluorine atoms, which can then react with the deposited materials. The plasma may be remote from the surfaces to be cleaned and the dissociated gas transported to the surfaces. Alternately, the atomic fluorine can be formed or generated within the ion source 202 to clean the surfaces.

The throttle mechanism 204 prevents or mitigates un-reacted atomic fluorine from exiting the ion source 202. The throttle mechanism 204 may comprise, for example, a blocking member (not shown) that at least partially covers the ion source's aperture. As a result, un-reacted atomic fluorine is at least partially prevented from exiting the ion source 202 via the aperture. As another example, the throttle mechanism 204 may comprise a movable suppression electrode (not shown) that at least partially covers the ion source's aperture during cleaning but is moved during normal operation to allow and generate passage of an ion beam.

The controller 208 controls operation of the ion source 206 and the throttle mechanism 204. The controller 208, in this aspect, controls flow rates and/or composition of the cleaning material provided to the ion source 202 as well as starting and duration of cleaning operations. The controller 208 also controls engagement of the throttle mechanism 204. Generally, the throttle mechanism 204 is engaged during cleaning operations or cleaning cycles and disengaged during normal operations. Additionally, the controller 208 can also control the rate of exhaust via the ion source's aperture. For example, the controller 208 can cause the throttle mechanism 204 to completely cover the aperture or, cover a selected percentage of the aperture in order to provide a selected exhaust rate. Additionally, the controller 208 can, in some, but not necessarily all aspects, detect and/or measure deposit buildup on surfaces within the ion source 202. Based on the measured and/or detected deposit buildup, the controller 208 can selectively initiate or refrain from performing cleaning cycles or operations.

Figure 3:
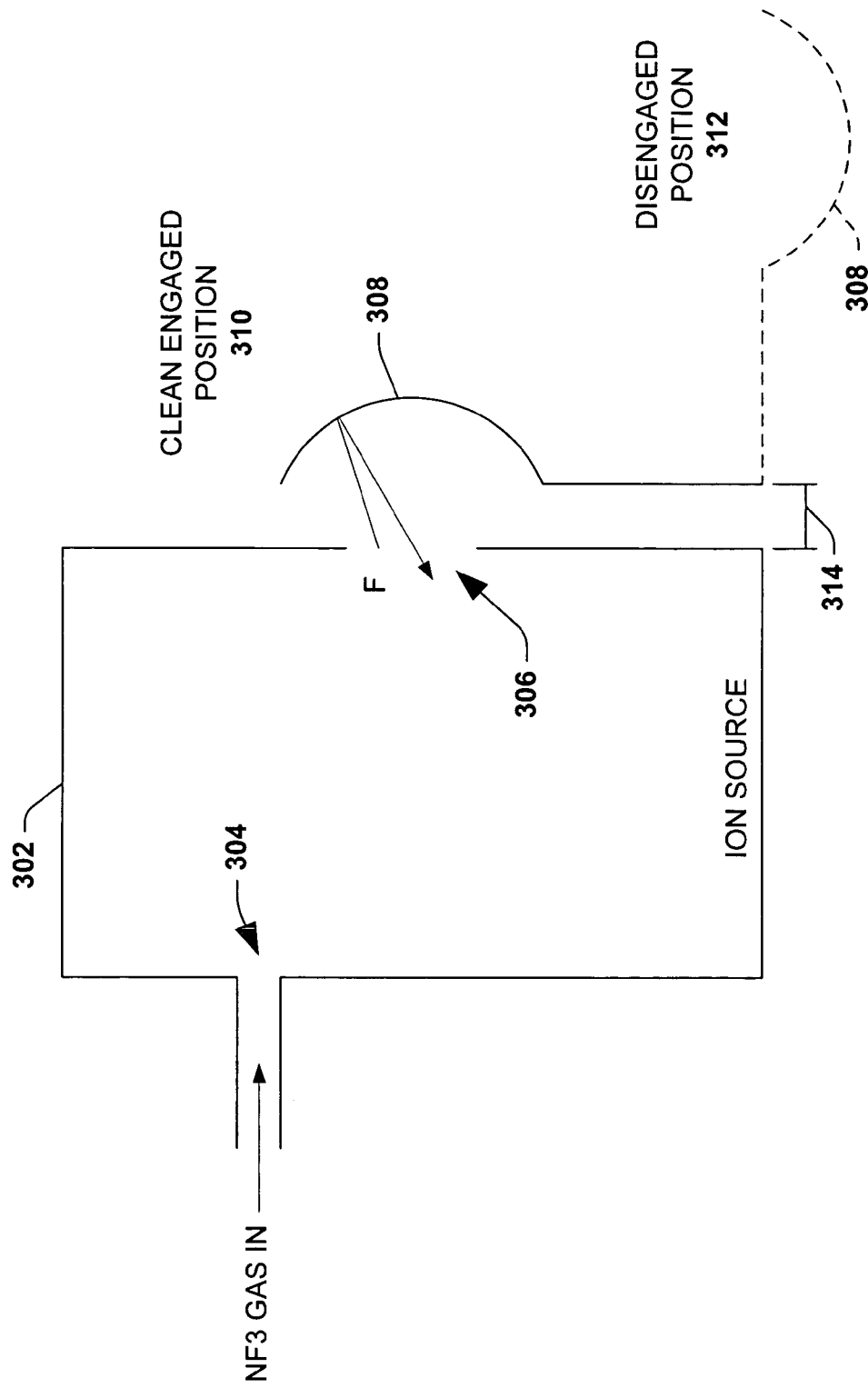
FIG. 3 is a diagram illustrating an ion source deposit cleaning system in accordance with an aspect of the present invention.

FIG. 3 is a diagram illustrating an ion source deposit cleaning system 300 in accordance with an aspect of the present invention. The system 300 employs a movable throttle member 308 that can mitigate or prevent unreacted cleaning components from exiting an ion source 302 during cleaning operations or cycles.

The ion source 302 is operable to produce an ion beam comprising one or more selected dopants. The ion beam source 302 can include, for example, a plasma source with an associated power source. The plasma source may, for example, comprise a relatively long plasma confinement chamber from which an ion beam is extracted. The ion beam is extracted or formed through an aperture 306 by employing electrodes as described above. Dopants and/or dopant materials can deposit and/or form on surfaces, including the aperture 306, within the ion source 302 during operation or generation of ion beams.

An inlet or valve 304 provides a cleaning material, such as NF3 or atomic fluorine to the ion source 302. The cleaning material reacts with the formed deposits to create a gas, which can then be exhausted from the ion source 302.

The throttle member 308 acts as a throttle mechanism to limit or mitigate unreacted cleaning material from exiting the ion source 302 via the aperture 306. The throttle member 308 is depicted as having a curved upper portion that facilitates returning unreacted cleaning material to the ion source 302 and a lower portion or arm. It is noted that alternate aspects of the invention include throttle members of varying shapes that partially block the aperture 306 and mitigate unreacted cleaning material from exiting the ion source 302.

Additionally, the throttle member 308, in this example, has an engaged position 310 and a disengaged position 312. In the engaged position 310, also referred to as a cleaning position, the member 308 is positioned so as to at least partially cover the aperture 306 and mitigate exiting of unreacted cleaning material from the ion source 302. It is noted, that while in the engaged position 310, ion beam generation is generally prevented. The member 308 is positioned away from the aperture 306 by a distance or gap referred to as a throttle gap 314. Increasing this distance allows more exhaust from the ion source 302 and decreasing this distance allows less exhaust from the ion source 302.

In the disengaged position, the member 308 is positioned away from the ion source aperture 306 so as to permit normal ion beam generation to continue. The member 308 is depicted as being pivoted or rotated about the lower portion or arm in order to move the member 308 away from the aperture 306. However, it is appreciated that other techniques can be employed to properly move the member 308 and permit normal ion beam generation, such as sliding the member 308 above or below the shown engaged position 310. It is noted that the cleaning material can still be supplied with the member 308 in the disengaged position 312, but the flow of the cleaning material is typically required to be greater.

Figure 4A:
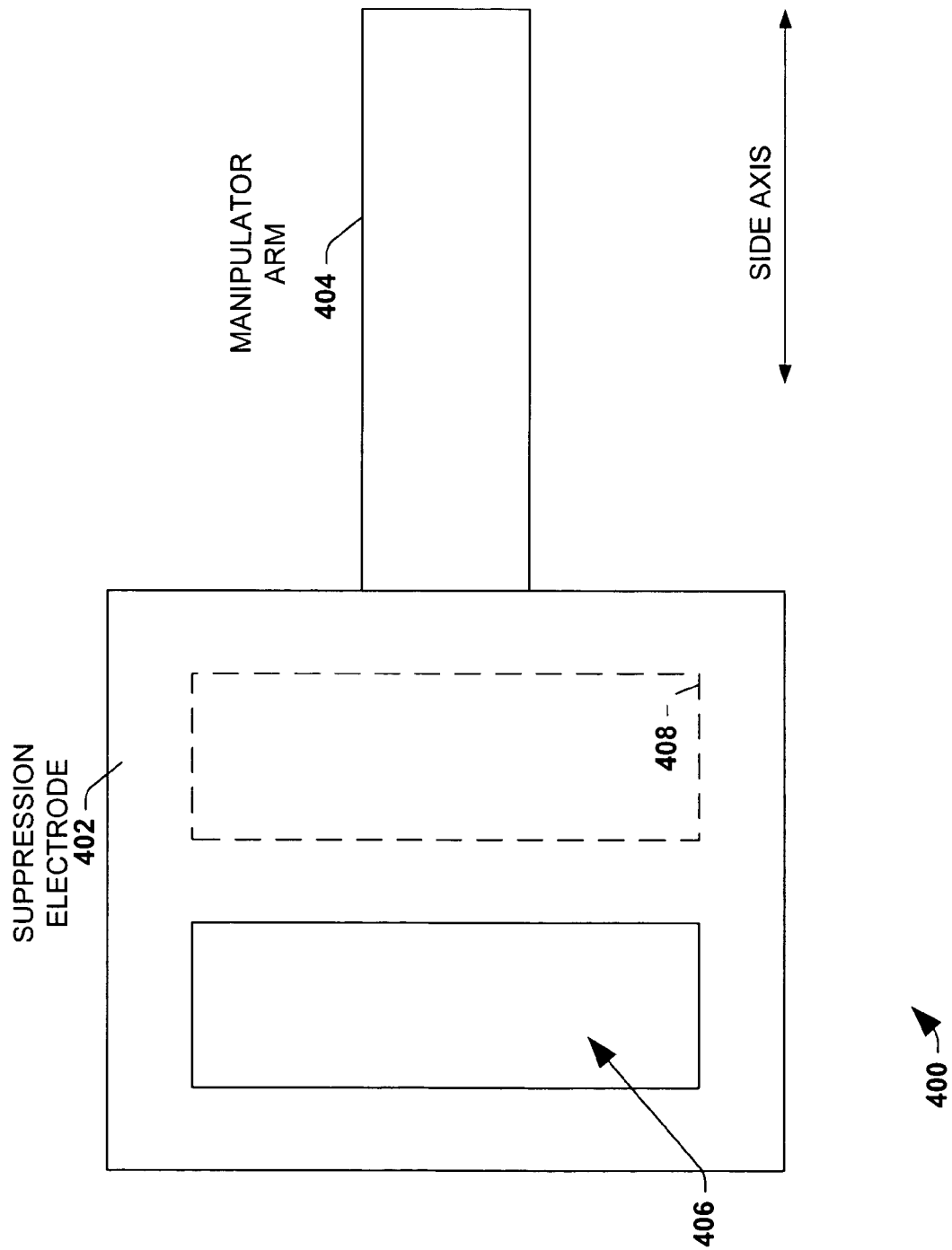
FIG. 4A is a top view of a throttle mechanism in accordance with an aspect of the present invention.

FIG. 4A is an elevation view of a throttle mechanism 400 in accordance with an aspect of the present invention. The throttle mechanism 400 employs a suppression electrode 402 to limit or mitigate unreacted cleaning material from exiting an ion source via an aperture. The throttle mechanism 400 can move or slide along a side axis in order to controllably throttle the aperture of the ion source.

The throttle mechanism 400 includes the suppression electrode 402 and a manipulator arm 404. The suppression electrode 402 operates in conjunction with a plasma electrode located within the ion source (not shown) and a ground electrode (not shown) positioned downstream to extract and form an ion beam having a desired shape, current, and the like during beam generation. The manipulator arm 404 holds and supports the electrode 402. A suppression aperture 406 is defined on the electrode 402 through which the ion beam is formed and passes through. During beam generation, the electrode 402 is positioned along the side axis such that the aperture is at or about the aperture of the ion source.

Additionally, the suppression electrode 402 also includes a throttle portion 408 defined or formed on/in the electrode that can mitigate or limit unreacted cleaning material from exiting the ion source during cleaning operations or cycles. The throttle portion 408 can, for example, be a solid portion of the electrode 402. Alternately, the throttle portion 408 can be formed into the electrode 402 with a defined profile and/or formed of other materials.

It is noted that the mechanism 400 described in FIG. 4 is merely one example of a suitable electrode based throttle mechanism in accordance with aspects of the present invention. It is appreciated, for example, that a ground electrode can be employed in a similar fashion to limit exiting of unreacted cleaning materials.

Figure 4B:
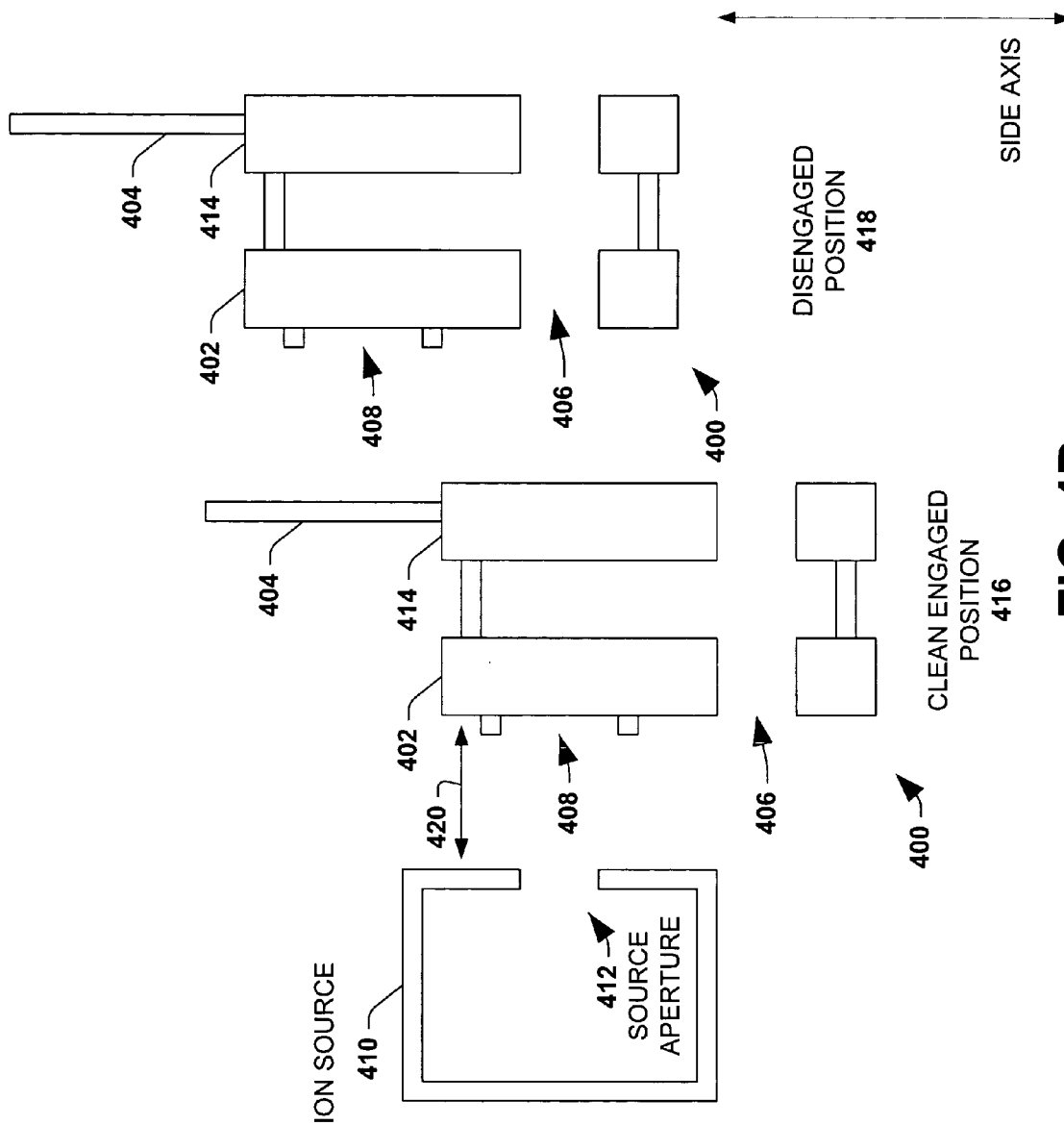
FIG. 4B is a side view of a throttle mechanism in accordance with an aspect of the present invention.

FIG. 4B is a top view of the throttle mechanism 400 of FIG. 4A in accordance with an aspect of the present invention. This view illustrates an ion source 410 along with the throttle mechanism 400 in an engaged position 416 or a disengaged position 418. The throttle mechanism 400 employs the suppression electrode 402 to limit or mitigate unreacted cleaning material from exiting an ion source via an aperture.

The ion source 410 includes a source aperture 412 through which dopants or ions pass through to thereby form as an ion beam. In this example, extraction and/or formation of the ion beam utilizes the suppression electrode 402 and a ground electrode 414, both of which are supported as a group by the arm 404.

The suppression aperture 406 is defined on the electrode 402 through which the ion beam is formed and passes through. During beam generation, the electrode 402 is positioned along the side axis such that the aperture 406 is at or about the aperture of the ion source as shown in the disengaged position 418. The throttle portion 408 of the suppression electrode 402 prevents or mitigates cleaning material from exiting the ion source 410 via the source aperture 412 by at least partially blocking the source aperture 412. The throttle portion 408 is positioned about the source aperture 412 during cleaning operations or cycles as shown in the engaged position 416. The throttle portion 408 is depicted, in this example, as being flat with respect to the suppression electrode 402.

The suppression aperture 406 is positioned a gap distance 420 away from the ion source aperture 412. During normal ion beam generation, the electrode 402 is in the throttle disengaged position 418 and the gap distance 420 is selected as a function of desired beam generation characteristics, such as beam current, size, shape, and the like. During cleaning cycles, the electrode 402 is arranged in the engaged position 416 and the gap distance 420 can be selected at least partially according to a desired exhaust rate or cleaning material containment rate.

Figure 4C:
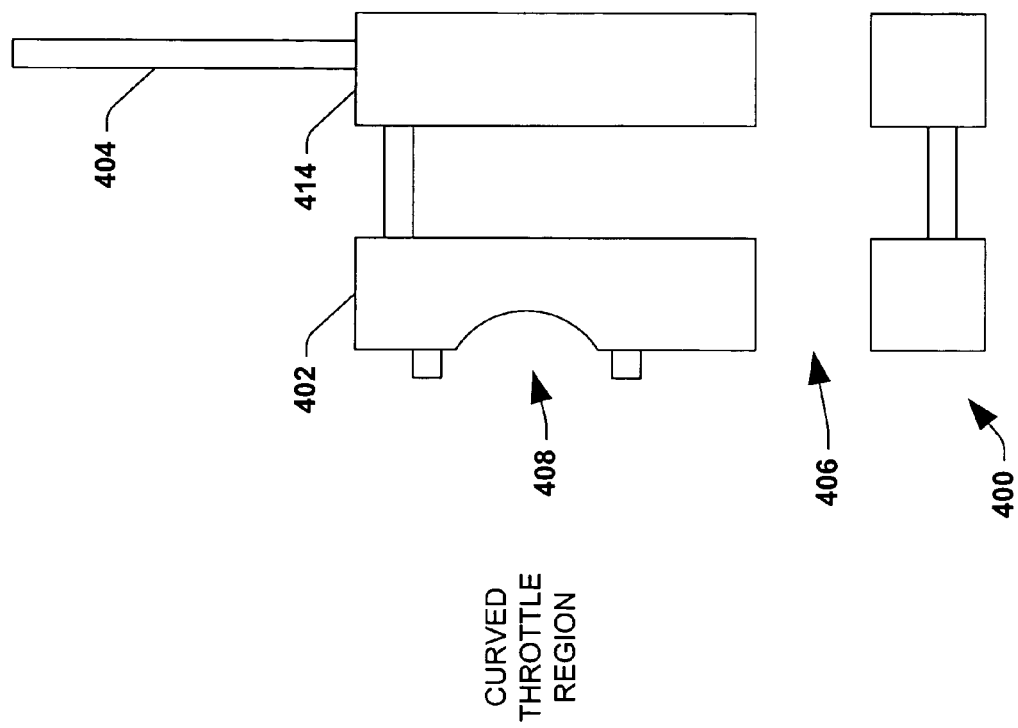
FIG. 4C is another side view of a throttle mechanism in accordance with an aspect of the present invention.

FIG. 4C is another top view of a throttle mechanism 400 in accordance with an aspect of the present invention. This view is similar to that shown in FIG. 4B, but with a different profile for the throttle portion 408. The other components are identical to those in FIG. 4B, which can be referenced for further description. The throttle portion 408, in this example, has a curvature or profile that further facilitates blocking cleaning material. This profile tends to redirect exiting cleaning material back through the ion source aperture 412.

It is appreciated that other profiles and variations for the throttle portion 408 are contemplated and in accordance with aspects of the present invention.

Figure 4D:
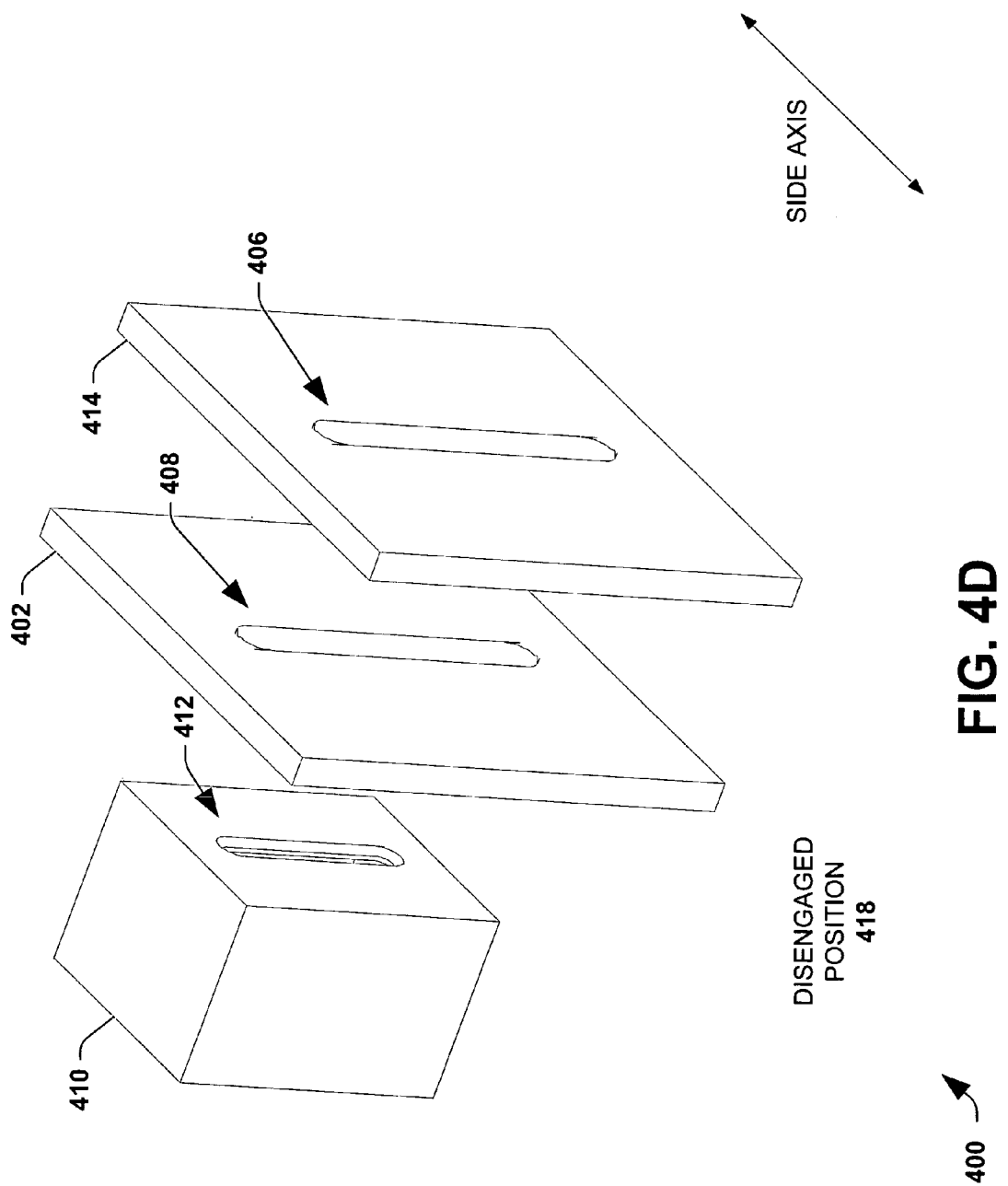
FIG. 4D is a perspective view of a throttle mechanism in accordance with an aspect of the present invention.

FIG. 4D is a perspective view of the throttle mechanism 400 of FIG. 4A in accordance with an aspect of the present invention. The view depicts the suppression electrode 402 located in the throttle disengaged position 418 to permit ion beam generation.

The view includes the ion source 410 and the source aperture 412. The suppression electrode 402 is located downstream of the ion source and the ground electrode 414 is located downstream of the suppression electrode 402. During ion beam generation, dopants or ions pass from the ion source 410 via the source aperture 412, through the aperture 406 of the suppression electrode 402 and through an aperture of the ground electrode 414.

The suppression electrode 402 can be moved along the side axis so that the throttle region 408 of the suppression electrode is positioned about the ion source aperture 412 instead of the aperture 406 being positioned about the ion source aperture 412 for cleaning operations or cycles.

Figure 5:
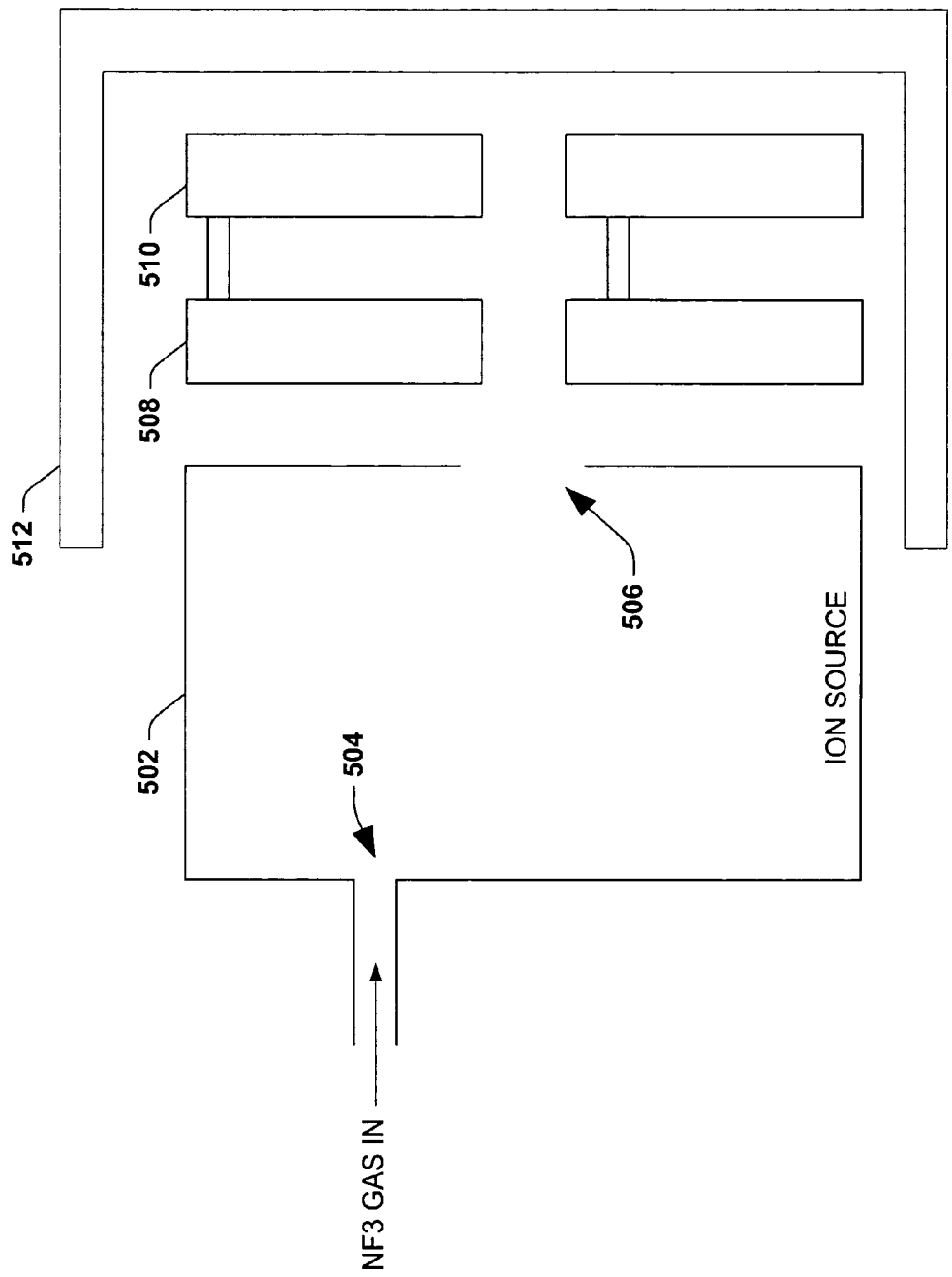
FIG. 5 is a diagram illustrating an ion source deposit and electrode deposit cleaning system in accordance with an aspect of the present invention.

FIG. 5 is a diagram illustrating an ion source deposit and electrode deposit cleaning system 500 in accordance with an aspect of the present invention. The system 500 employs a throttle member that can mitigate or prevent unreacted cleaning components from exiting an ion source and electrode region during cleaning operations or cycles.

The ion source 502 is operable to produce an ion beam comprising one or more selected dopants. The ion beam source 502 can include, for example, a plasma source with an associated power source. The plasma source may, for example, comprise a relatively long plasma confinement chamber from which an ion beam is extracted. The ion beam is extracted or formed through an aperture 506 by employing a suppression electrode 508 and a ground electrode 510.

Dopants and/or dopant materials can deposit and/or form on surfaces, including the aperture 506, within the ion source 502 during operation or generation of ion beams. Additionally, dopants and/or dopant materials can also deposit and/or form on surfaces the suppression electrode 508 and the ground electrode 510. If not removed, these deposited materials can degrade performance of the ion source 502 and the electrodes 508, 510.

An inlet or valve 504 provides a cleaning material, such as NF3 or atomic fluorine to the ion source 502. The cleaning material reacts with the formed deposits on surfaces of the ion source 502 and the electrodes 508, 510 to create a gas, which can then be exhausted from the ion source and electrode region, which includes both the ion source 502 and the electrodes 508, 510.

A throttle member 512 acts as a throttle mechanism to limit or mitigate unreacted cleaning material from exiting the ion source and electrode region. The throttle member encompasses the ion source aperture and the electrodes 508, 510, as shown in FIG. 5. In this aspect, the throttle member 512 is located downstream of the electrodes 508, 510. Although not shown, the throttle member 512 can include an arm or other member to facilitate placement and/or removal from an ion beam path. During non-cleaning operation, the member 512 can be removed or disengaged. During cleaning operations, the member 512 is positioned in place or engaged to mitigate unreacted cleaning material from exiting the ion source and electrode region. The electrodes 508, 510 can be positioned nearer the ion source 502 during the cleaning operations in order to facilitate cleaning. In one example, the electrodes 508, 510 are posited to within 1 mm of the ion source aperture 506 during cleaning.

It is noted that the cleaning material can still be supplied with the member 512 in the disengaged position, but the flow of the cleaning material is typically required to be greater. It is also noted that other suitable combinations are envisioned: for example cleaning with the member in both engaged and disengaged positions in subsequent steps so that the surrounding source housing gets a benefit from the cleaning process.

Figure 6:
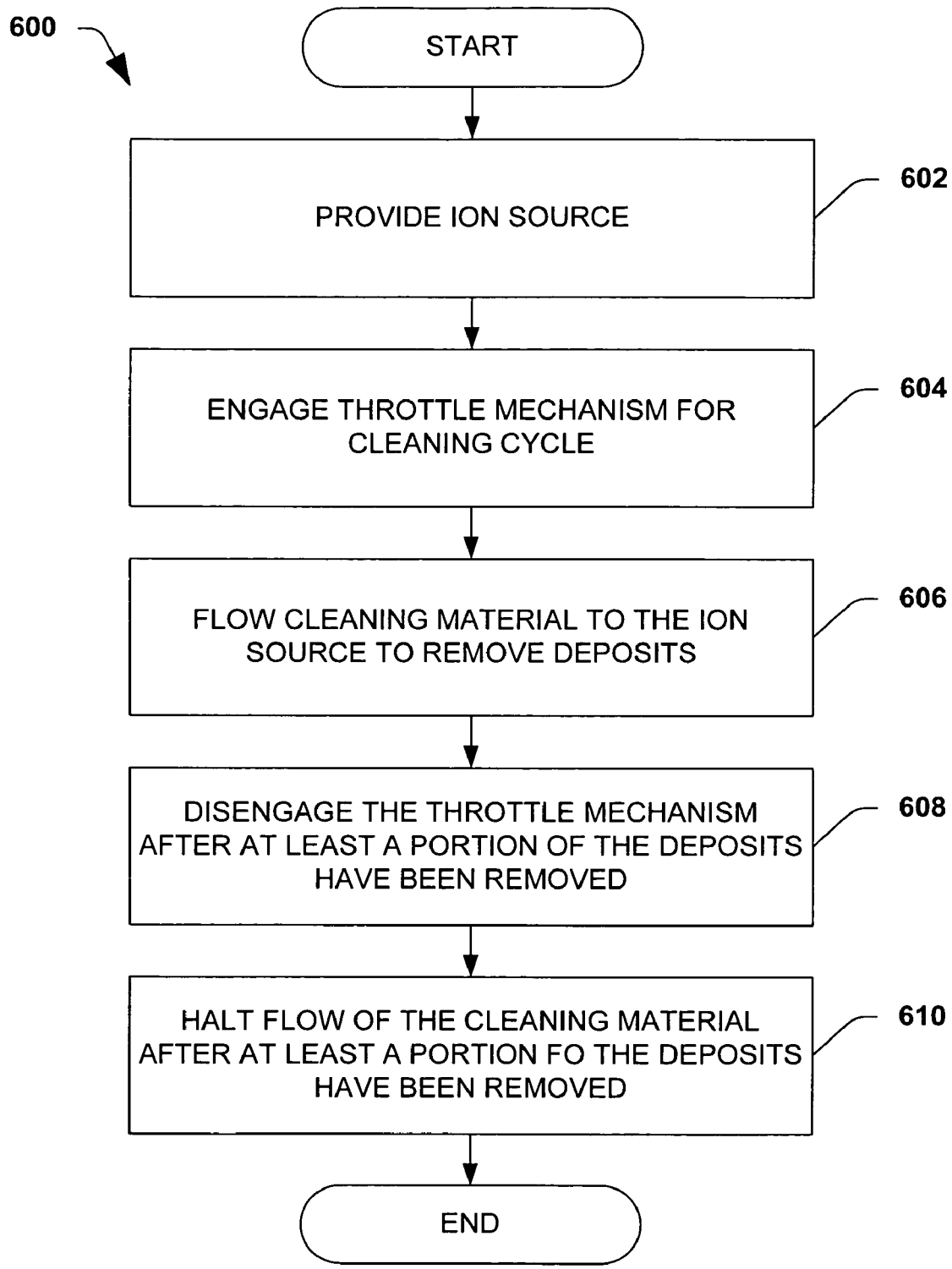
FIG. 6 is a flow diagram illustrating a method of cleaning deposits from surfaces within an ion source in accordance with an aspect of the present invention.

FIG. 6 is a flow diagram illustrating a method 600 of cleaning deposits from surfaces within an ion source in accordance with an aspect of the present invention. The method 600 employs a throttle mechanism during cleaning in order to facilitate cleaning and allow a reduced flow rate of cleaning material, such as atomic fluorine. The above figures and description can also be referenced with this method 600 for further description.

The method 600 begins at block 602 wherein an ion source having interior surfaces, including a source aperture, is provided. Some dopant species can condense or form on the surfaces of the ion source and interfere with ion source operation over time, for example by changing the electrical characteristics of the walls or partially blocking the ion source electrode aperture, thereby reducing the available ion current. For example, phosphorous (P) may form when phosphine (PH$_3$) is run through the ion source.

A throttle mechanism is engaged at block 604 that limits or prevents exiting of cleaning materials from the ion source by at least partially covering the ion source aperture. The throttle mechanism can be engaged by, for example, sliding a throttle member over the ion source aperture or moving a suppression electrode having a throttle region such that the throttle region is positioned about the ion source aperture. The throttle mechanism can be positioned according to a selected exhaust rate or cleaning material containment rate.

Cleaning material in introduced into the ion source at block 606 at a selected flow rate. The cleaning material includes, for example, atoms or compounds that react with and/or remove deposits from the surfaces of the ion source. As an example, atomic fluorine is encouraged to react with deposited boron resulting in a gas that is exhausted. This reaction results in a gas that is exhausted via the ion source aperture.

The selected flow rate can vary according to the amount of deposits formed and desired cleaning to be obtained. It is noted that engagement of the throttle mechanism reduces the flow rate required for the cleaning operation. It is also noted that the flow rate can vary during the cleaning cycle.

After at least a portion of the deposits have been removed by the cleaning material, the throttle mechanism is disengaged at block 608. The removed deposits can be identified by a specific duration of time or some deposit inspection mechanism. Additionally, after at least a portion of the deposits have been removed by the cleaning material, the flow of the cleaning material to the ion source is halted at block 610. It is noted that blocks 610 and 608 can be performed at varied times.

While, for purposes of simplicity of explanation, the method 600 is depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features or blocks may be required to implement a methodology in accordance with an aspect the present invention.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising." Additionally, the term "exemplary" is intended to indicate an example and not a best or superior aspect or implementation.

What is claimed is:

1. An ion implantation system comprising:
    an ion source comprising interior surfaces and a source aperture and generates an ion beam during an operating state;
    a deposit cleaning system that employs a cleaning material to remove deposits from the surfaces and the source aperture of the ion source and a throttle mechanism to mitigate loss of the cleaning material through the source aperture during a cleaning state;
    a beam line assembly that receives the ion beam from the ion source and processes the ion beam; and a target location that receives the ion beam from the beam line assembly.

2. The system of claim 1, wherein the deposit cleaning system comprises:
   a cleaning source for supplying the cleaning material to the ion source; and
   a controller that controls the supply and flow rate of the cleaning material from the cleaning source to the ion source and that controls the positioning of the throttle mechanism.

3. The system of claim 2, wherein the throttle mechanism comprises a throttle member comprising a curved upper portion and a lower portion, wherein the curved upper portion at least partially covers the source aperture during the cleaning state.

4. The system of claim 2, wherein the throttle mechanism comprises a movable electrode that includes a throttle region, wherein the movable electrode is positioned so that the throttle region at least partially covers the source aperture during the cleaning state.

5. The system of claim 2, wherein the controller determines an amount of the deposits present, initiates the cleaning state by flowing the cleaning material and engaging the throttle mechanism, and terminates the cleaning state after removal of the deposits by halting flow of the cleaning material and disengaging the throttle mechanism.

6. The system of claim 2, wherein the controller selects an exhaust rate from the source aperture of the ion source and positions a throttle member of the throttle mechanism according to the exhausts rate.

7. The system of claim 1, wherein the cleaning material is fluorine.

8. The system of claim 1, wherein the deposits comprise dopant containing materials adhered to the interior surfaces of the ion source.

9. The system of claim 1, further comprising a controller that causes the system to enter the cleaning state after a fixed duration of the system in the operating state.

10. The system of claim 1, further comprising a controller that causes the system to enter the cleaning state on detecting the deposits present within the ion source being above a threshold value.

11. A deposit cleaning system comprising:
   an ion source comprising interior surfaces and a source aperture and generates an ion beam during an operating state;
   a cleaning material source for supplying cleaning material to the ion source;
   a throttle mechanism comprising a throttle member positionable at least in an engaged position and a disengaged position with respect to said source aperture;
   a controller that controls a supply and a rate of the cleaning material from the cleaning source to the ion source and that controls the positioning of the throttle member.

12. The system of claim 11, wherein the cleaning material comprises atomic fluorine.

13. The system of claim 11, wherein the cleaning material comprises a fluorine compound.

14. The system of claim 11, wherein the throttle member mitigates exhaust of unreacted portions of the cleaning material as positioned in the engaged position.

15. The system of claim 11, further comprising a plasma electrode located within the ion source, a suppression electrode positioned downstream of the ion source, and a ground electrode positioned downstream of the suppression electrode.

16. The system of claim 15, wherein the suppression electrode comprises the throttle member and a suppression aperture and positions the throttle member about the source aperture in the engaged position and positions the suppression aperture about the source aperture in the disengaged position.

17. The system of claim 15, wherein the suppression electrode comprises a suppression aperture positioned about the source aperture and the ground electrode comprises the throttle member and a ground aperture and positions the throttle member about the suppression aperture while in the engaged position and positions the ground aperture about the suppression aperture while in the disengaged position.

18. The system of claim 15, wherein the throttle mechanism is positioned downstream of the ground electrode.

19. A deposit cleaning system comprising:
   an ion source comprising interior surfaces and a source aperture and generates an ion beam during an operating state;
   a cleaning material source for supplying cleaning material to the ion source;
   a suppression electrode positioned downstream of the ion source aperture;
   a ground electrode positioned downstream of the suppression electrode;
   a throttle mechanism comprising a throttle member that at least partially encompasses the source aperture of the ion source, the suppression electrode, and the ground electrode; and
   a controller that controls a supply and a rate of the cleaning material from the cleaning source to the ion source and that controls the positioning of the throttle member.

20. The deposit cleaning system of claim 19, wherein the suppression electrode and the ground electrode are positioned nearer the source aperture during a cleaning operation.

21. The deposit cleaning system of claim 19, wherein the throttle mechanism mitigates unreacted cleaning material from exiting a region encompassing the source aperture, the suppression electrode, and the ground electrode.

22. A method of cleaning deposits from surfaces of an ion source comprising:
   engaging a throttle mechanism that at least partially covers a source aperture of an ion source;
   introducing a cleaning material into the ion source;
   reacting the cleaning material with deposits formed on surfaces of the ion source to remove the deposits;
   exhausting the reacted cleaning material; and
   mitigating loss of unreacted cleaning material through the source aperture by the throttle mechanism.

23. The method of claim 22, further comprising selecting a cleaning material and flow rate prior to introducing the cleaning material into the ion source.

24. The method of claim 22, wherein reacting the cleaning material with the depositions comprising forming volatile compounds.

25. The method of claim 22, wherein exhausting the reacted cleaning material comprises exhausting the reacted cleaning material through the source aperture.

26. The method of claim 22, further comprising disengaging the throttle mechanism after a selected amount of the deposits have been removed.

* * * * *